US011877412B2

(12) United States Patent
Kawai et al.

(10) Patent No.: US 11,877,412 B2
(45) Date of Patent: Jan. 16, 2024

(54) ELECTRONIC CONTROL DEVICE

(71) Applicant: Hitachi Astemo, Ltd., Hitachinaka (JP)

(72) Inventors: Yoshio Kawai, Hitachinaka (JP); Ryo Akiba, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 52 days.

(21) Appl. No.: 17/626,884

(22) PCT Filed: Jul. 10, 2020

(86) PCT No.: PCT/JP2020/026967
§ 371 (c)(1),
(2) Date: Jan. 13, 2022

(87) PCT Pub. No.: WO2021/010308
PCT Pub. Date: Jan. 21, 2021

(65) Prior Publication Data
US 2022/0279671 A1 Sep. 1, 2022

(30) Foreign Application Priority Data
Jul. 17, 2019 (JP) .................................. 2019-131884

(51) Int. Cl.
*H05K 5/03* (2006.01)
*H05K 9/00* (2006.01)

(52) U.S. Cl.
CPC ............. *H05K 5/03* (2013.01); *H05K 9/0067* (2013.01)

(58) Field of Classification Search
CPC ...... H05K 5/03; H05K 9/0067; H05K 9/0007; H01L 23/36
(Continued)

(56) References Cited

U.S. PATENT DOCUMENTS 6,239,669 B1 * 5/2001 Koriyama ............... H01P 5/107
333/26
2009/0251843 A1 * 10/2009 Hironaka ............. H05K 9/0067
361/216
(Continued)

FOREIGN PATENT DOCUMENTS

JP   7-288367 A   10/1995
JP   2002-368436 A   12/2002
(Continued)

OTHER PUBLICATIONS

International Search Report (PCT/ISA/210) issued in PCT Application No. PCT/JP2020/026967 dated Nov. 2, 2020 with English translation (six (6) pages).
(Continued)

*Primary Examiner* — Danny Nguyen
(74) *Attorney, Agent, or Firm* — Crowell & Moring LLP

(57) ABSTRACT

Provided is an electronic control device capable of suppressing failure of an electronic component due to static electricity. The electronic control device 100 includes a substrate 10, an electronic component 1 mounted on the substrate 10, an insulating case 20 that holds the substrate 10, a conductive cover 30 that covers the insulating case 20, a conductive base 40 that holds the insulating case 20, and a conductive fixture 21 that fixes the insulating case 20 to the conductive base 40. A distance L1 between the conductive cover 30 and the conductive fixture 21 is equal to or less than a distance L2 between the conductive cover 30 and a conductive terminal 1a of the electronic component 1.

13 Claims, 11 Drawing Sheets

(58) Field of Classification Search
USPC .................................................. 361/212, 220
See application file for complete search history.

(56) References Cited

U.S. PATENT DOCUMENTS

2017/0356619 A1    12/2017  Roger et al.
2018/0351595 A1*   12/2018  Tarui .................... H05K 1/0204

FOREIGN PATENT DOCUMENTS

| JP | 2008-41585   A | 2/2008 |
| JP | 2011-222543  A | 11/2011 |
| JP | 2014-75496   A | 4/2014 |
| JP | 2014-120677  A | 6/2014 |

OTHER PUBLICATIONS

Japanese-language Written Opinion (PCT/ISA/237) issued in PCT Application No. PCT/JP2020/026967 dated Nov. 2, 2020 (five (5) pages).

\* cited by examiner

ELECTRONIC CONTROL DEVICE

TECHNICAL FIELD

The present invention relates to an electronic control device.

BACKGROUND ART

In recent years, an electronic control device for a vehicle has been mechanically and electrically integrated in view of an increase in the number of electronic control devices mounted on a vehicle and a reduction in the length of a connection cable between a control device and a sensor and between actuators. Specifically, the actuator for engine control and the electronic control device are integrated, and the transmission and the electronic control device are integrated.

Here, the surface temperature of the engine, the transmission, and the like is about 130° C. to 140° C., whereas the heat-resistant temperature of the electronic component used in the electronic control device is about 150° C.

When the electronic control device is operated in such a severe environment, heat of the engine, the transmission, and the like is transmitted to the electronic component on the substrate held by a case via the case (housing) of the electronic control device, and the temperature of the electronic component may exceed a heat-resistant temperature.

CITATION LIST

Patent Literature

PTL 1: JP 2014-075496 A

SUMMARY OF INVENTION

Technical Problem

In the electronic control device disclosed in PTL 1, since the case for holding the substrate is made of metal (alloy), heat of the engine, the transmission, and the like is easily transferred to the electronic component via the case (housing). Therefore, in order to suppress a temperature rise of an electronic component due to heat of the engine, the transmission, and the like, it is conceivable that the case of the electronic control device is made of resin.

However, there arises a new problem that static electricity applied to the metal cover from a user's hand or the like is not discharged to the resin case. In addition, there is a concern that static electricity is discharged to the electronic component and the electronic component breaks down.

An object of the present invention is to provide an electronic control device capable of suppressing failure of an electronic component due to static electricity.

Solution to Problem

In order to achieve the above object, the present invention provides an electronic control device, including: a substrate; an electronic component mounted on the substrate; an insulating case that holds the substrate; a conductive cover that covers the insulating case; a conductive base that holds the insulating case; and a conductive fixture that fixes the insulating case to the conductive base. A distance L1 between the conductive cover and the conductive fixture is equal to or less than a distance L2 between the conductive cover and a conductive terminal of the electronic component.

Advantageous Effects of Invention

According to the present invention, it is possible to suppress failure of an electronic component due to static electricity. Objects, configurations, and effects besides the above description will be apparent through the explanation on the following embodiments.

DESCRIPTION OF EMBODIMENTS

Figure 1:
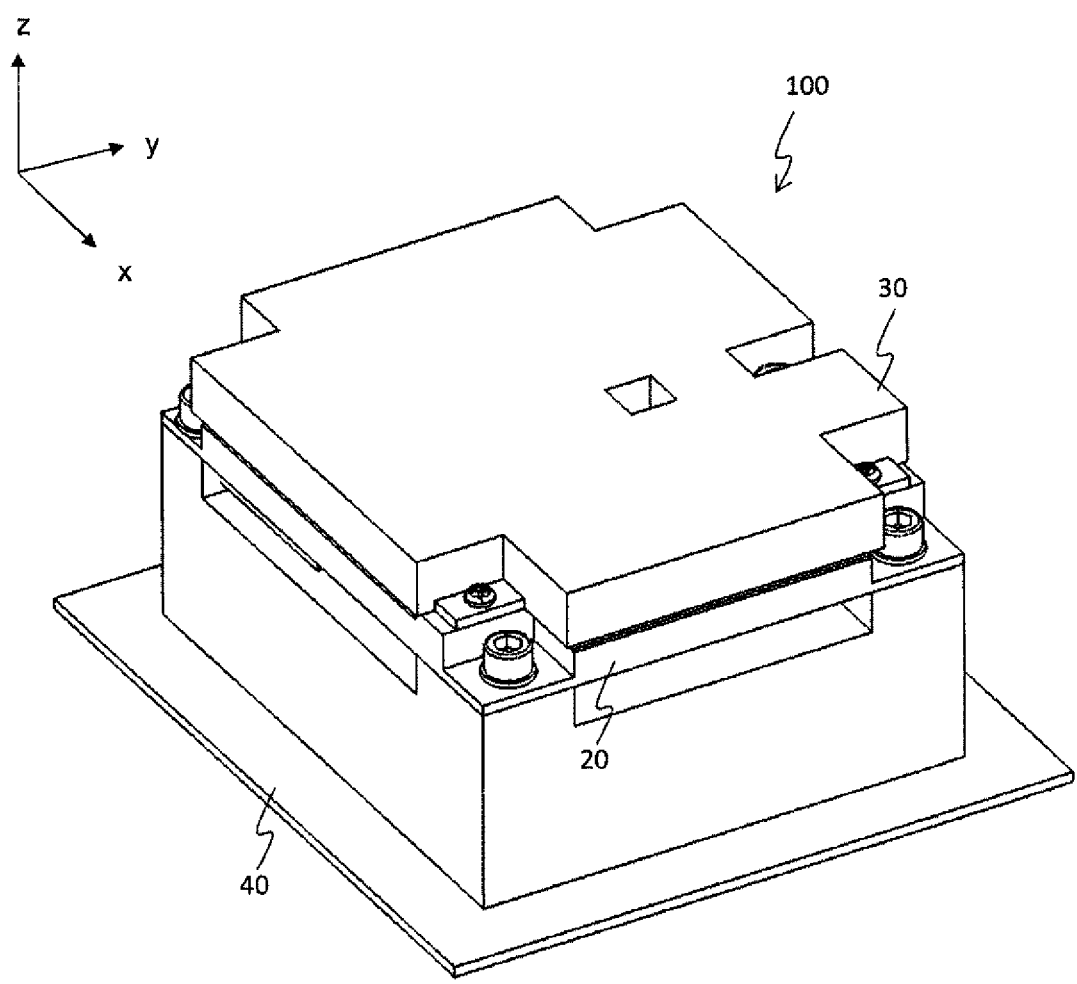
FIG. 1 is a perspective view illustrating an overall configuration of an electronic control device according to a first embodiment.

Hereinafter, the configuration of an electronic control device according to the first to third embodiments of the invention will be described with reference to the drawings. The electronic control device controls, for example, an actuator (electromagnetic valve or the like) used for an engine, a transmission, and the like. Further, the same symbols in the drawings indicate the same portion.

First Embodiment

First, a configuration of an electronic control device 100 according to a first embodiment will be described with reference to FIG. 1. FIG. 1 is a perspective view illustrating an overall configuration of an electronic control device 100 according to a first embodiment.

The electronic control device 100 includes an insulating case 20, a conductive cover 30, and a conductive base 40.

The insulating case 20 and the conductive cover 30 constitute a housing that houses electronic components and the like.

The conductive base 40 holds the insulating case 20. The conductive base 40 is attached to an engine, a transmission, or the like.

The insulating case 20 is made of, for example, an insulating resin. Since the insulating case 20 is made of resin, heat from an engine, a transmission, and the like is less likely to be transferred to electronic components and the like. The thermal conductivity of the insulating case 20 is smaller than the thermal conductivity of the conductive cover 30 and smaller than the thermal conductivity of a housing of an engine, a transmission, or the like.

The conductive cover 30 and the conductive base 40 are made of, for example, a conductive metal (aluminum, steel, steel plate, etc.) or a conductive resin, and are molded by casting, pressing, injection molding, or the like.

Figure 2:
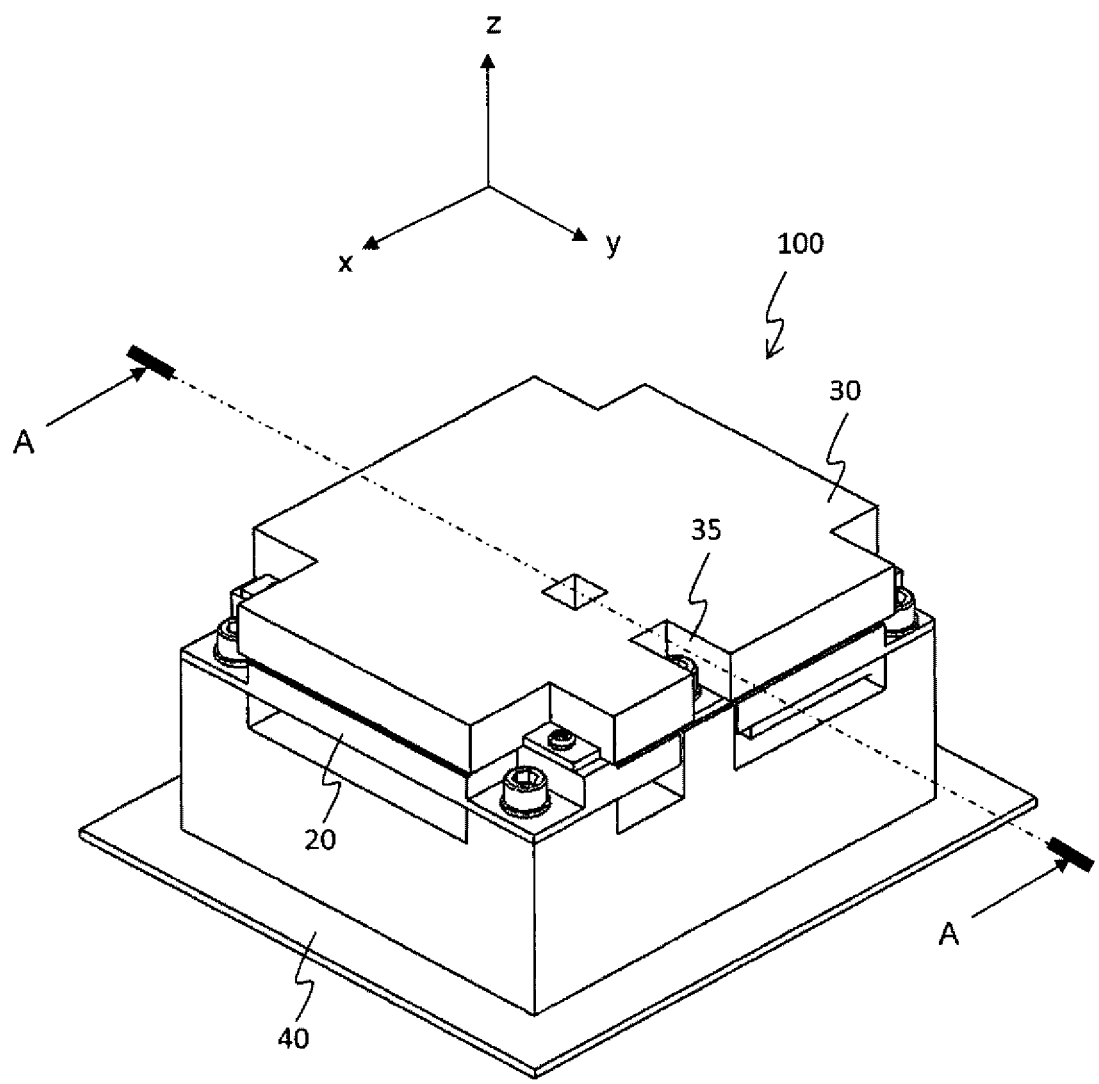
FIG. 2 is a perspective view of the electronic control device illustrated in FIG. 1 as viewed from another direction.

Next, a configuration of the electronic control device 100 according to the first embodiment will be described with reference to FIGS. 2 and 3. FIG. 2 is a perspective view of the electronic control device 100 illustrated in FIG. 1 as viewed from another direction, and FIG. 3 is an A-A sectional view taken along line A-A illustrated in FIG. 2.

Figure 3:
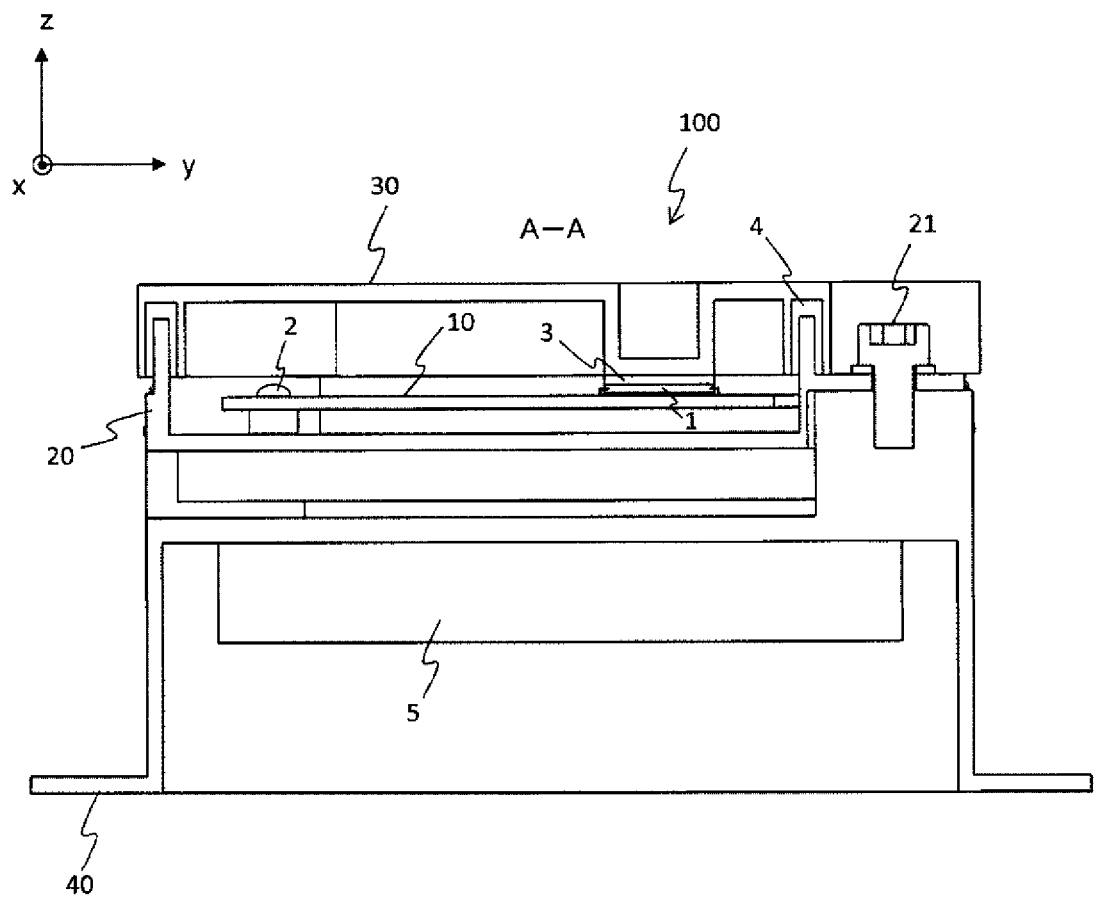
FIG. 3 is an A-A sectional view taken along line A-A illustrated in FIG. 2.

As illustrated in FIG. 3, the electronic control device 100 mainly includes a substrate 10, the insulating case 20 that holds the substrate 10, the conductive cover 30 that covers the insulating case 20, and the conductive base 40 that holds the insulating case 20. As illustrated in FIG. 2, the conductive cover 30 has a notch 35. Details thereof will be described later with reference to FIG. 5.

As illustrated in FIG. 3, an electronic component 1 is mounted on the substrate 10. The electronic component 1 includes, for example, a semiconductor element. Specific examples of the electronic component 1 include a processor that calculates a control amount of an actuator from output values of various sensors (temperature sensor, pressure sensor, and the like), and a driver circuit that supplies a drive current to the actuator by switching.

The driver circuit may be mounted on the actuator. The electronic component 1 is electrically connected to an actuator used for an engine, a transmission, and the like via a wiring pattern of the substrate 10, a pin of a connector 5, and the like.

Heat generated from the electronic component 1 is transferred to the conductive cover 30 via the thermal conductive material 3. Then, the heat transferred to the conductive cover 30 is dissipated to the atmosphere. In the present embodiment, the thermal conductive material 3 contains ceramics and the like.

The conductive fixture 2 (screws, bolts, rivets, caulking, etc.) fixes the substrate 10 to the insulating case 20. The conductive fixture 21 fixes the insulating case 20 to the conductive base 40.

The conductive fixture 2 and the conductive fixture 21 are made of, for example, conductive metal or resin.

A sealing material 4 seals between the conductive cover 30 and the insulating case 20, and waterproofs the inside of the housing including the conductive cover 30 and the insulating case 20. The sealing material 4 is, for example, a silicon adhesive.

Next, features of the electronic control device 100 according to the present embodiment will be described with reference to FIGS. 4 and 5.

Figure 4:
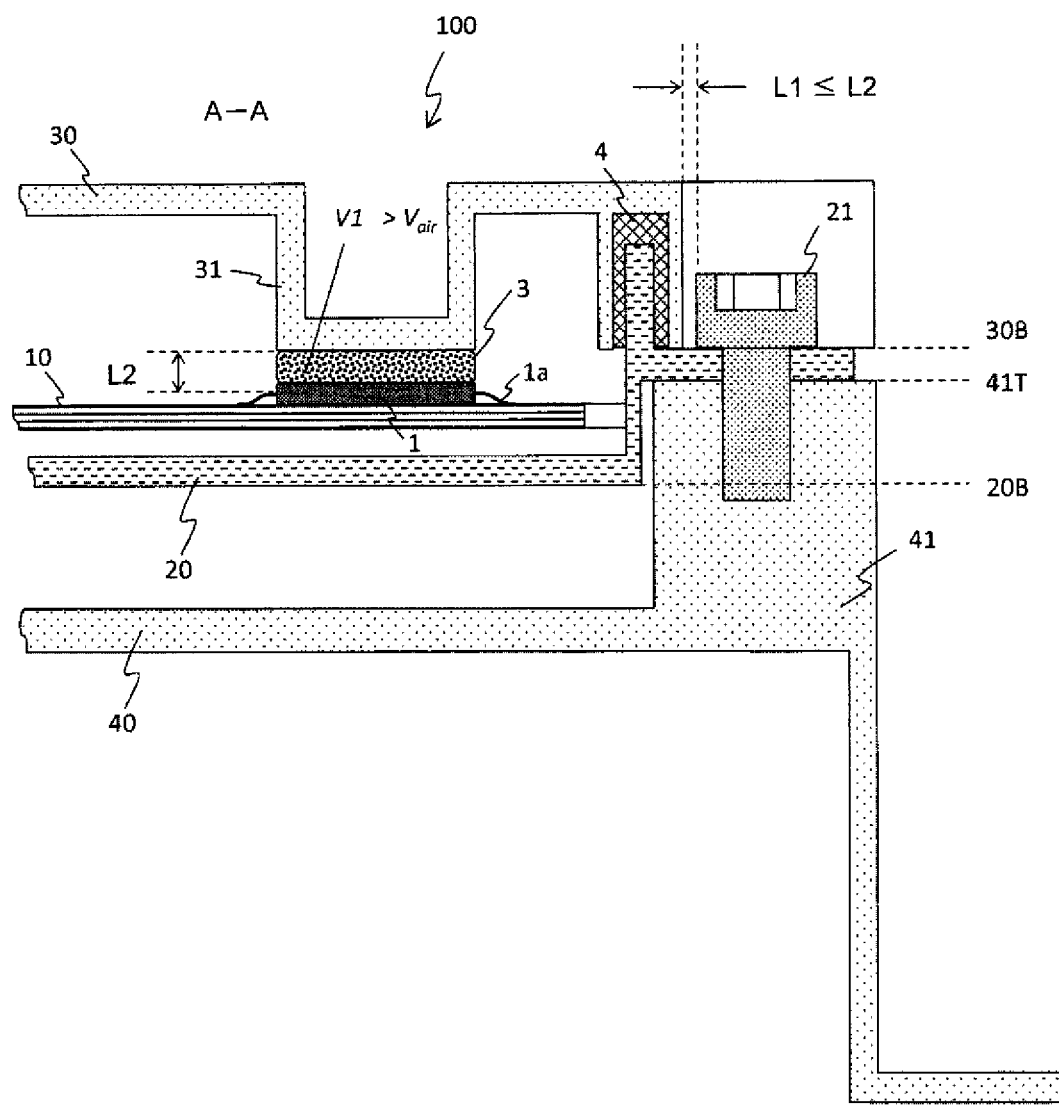
FIG. 4 is an enlarged sectional view illustrating a peripheral configuration of a conductive fixture of the electronic control device illustrated in FIG. 3.
Figure 5:
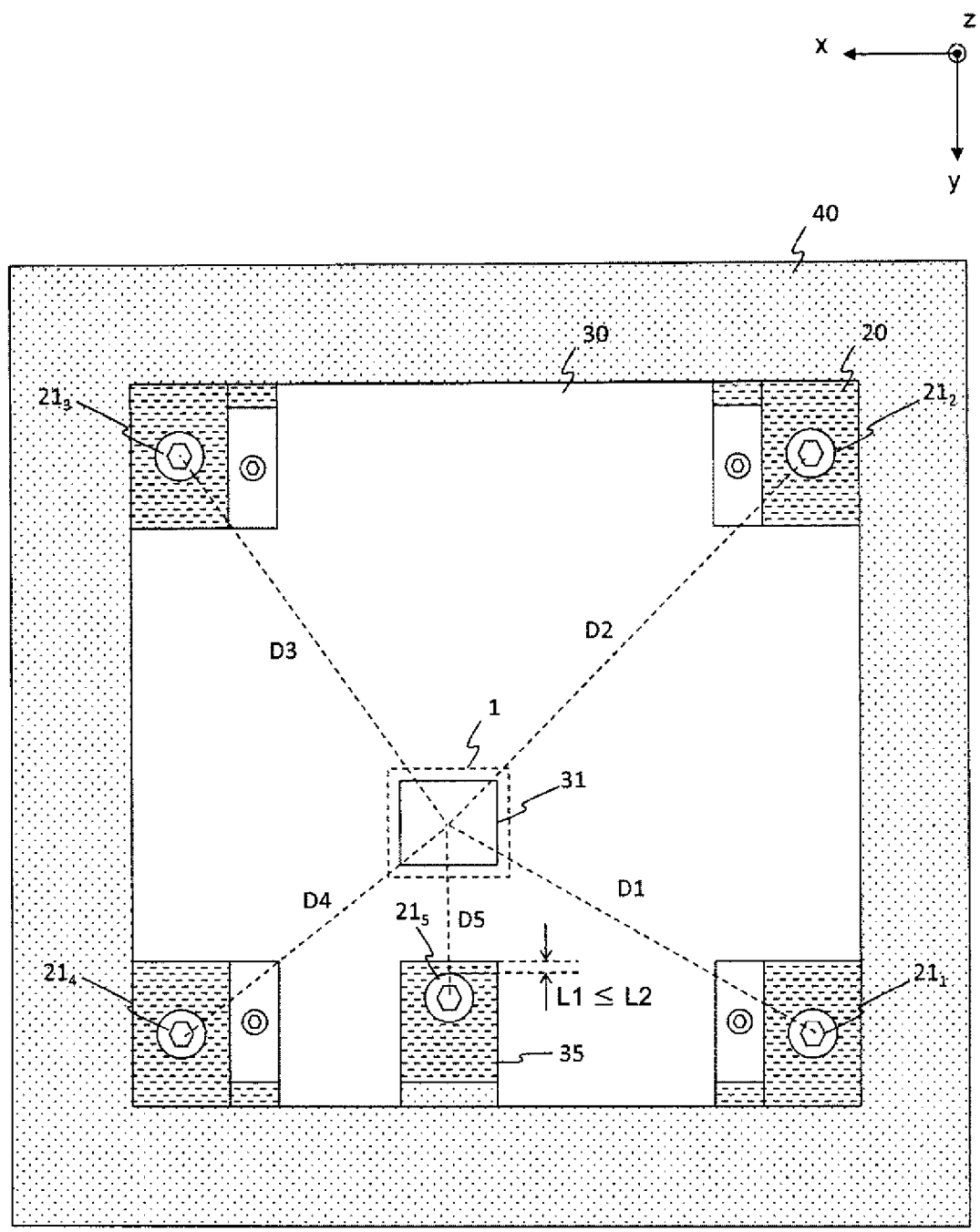
FIG. 5 is a plan view of the electronic control device illustrated in FIG. 3.

FIG. 4 is an enlarged sectional view illustrating a peripheral configuration of the conductive fixture 21 of the electronic control device 100 illustrated in FIG. 3, and FIG. 5 is a plan view of the electronic control device 100 illustrated in FIG. 3.

As illustrated in FIG. 4, the electronic control device 100 includes at least the substrate 10, the electronic component 1 mounted on the substrate 10, the insulating case 20 that holds the substrate 10, the conductive cover 30 that covers the insulating case 20, the conductive base 40 that holds the insulating case 20, and the conductive fixture 21 that fixes the insulating case 20 to the conductive base 40. A distance L1 between the conductive cover 30 and the conductive fixture 21 is equal to or less than a distance L2 between the conductive cover 30 and a conductive terminal 1a of the electronic component 1.

As a result, static electricity applied to the conductive cover 30 is more easily discharged to the conductive fixture 21 than the conductive terminal 1a of the electronic component 1. Therefore, it is possible to suppress failure of the electronic component 1 due to static electricity. In addition, it is possible to suppress malfunction of the electronic component 1 due to static electricity. Further, since the conductive cover 30 is not in contact with the conductive fixture 21, heat from an engine, a transmission, or the like to which the conductive base 40 is attached is less likely to be transferred to the conductive cover 30.

In the present embodiment, the thermal conductive material 3 is disposed between the conductive cover 30 and the electronic component 1, and has a withstand voltage V1 higher than the air withstand voltage Vair. Consequently, static electricity applied to the conductive cover 30 is hardly discharged to the conductive terminal 1a of the electronic component 1. As a result, static electricity applied to the conductive cover 30 is more easily discharged to the conductive fixture 21 than the conductive terminal 1a of the electronic component 1.

The conductive base 40 includes a pedestal 41 having a hole (screw hole) into which the conductive fixture 21 is engaged (screwed). An end surface 41T of the pedestal 41 on the axial head side of the conductive fixture 21 is located between an end surface 30B of the conductive cover 30 on the axial foot side of the conductive fixture 21 and an end surface 20B of the insulating case 20 on the axial foot side of the conductive fixture 21.

Thus, the head of the conductive fixture 21 can be brought close to the conductive cover 30. As a result, static electricity applied to the conductive cover 30 is more easily discharged to the conductive fixture 21 than the conductive terminal 1a of the electronic component 1.

A protrusion 31 is provided in a portion of the conductive cover 30 facing the electronic component 1. The conductive fixture 21 is disposed outside an internal space surrounded by the conductive cover 30 and the insulating case 20. This improves workability when the insulating case 20 is fixed to the conductive base 40.

As illustrated in FIG. 5, a plurality of (five) conductive fixtures 21 ($21_1$ to $21_5$) are provided. $D5<D4<D1<D3<D2$ holds with respect to the distance D (D1 to D5) between the electronic component 1 and the conductive fixture 21 ($21_1$ to $21_5$).

The distance L1 between the conductive fixture $21_5$ closest to the electronic component 1 and the conductive cover 30 is equal to or less than the distance L2 between the conductive cover 30 and the conductive terminal 1a of the electronic component 1. As a result, static electricity applied to the conductive cover 30 is more easily discharged to the conductive fixture $21_5$ than conductive fixture $21_1$ to $21_4$.

In the present embodiment, the conductive cover 30 has the notch 35 above the head of the conductive fixture 21 closest to the electronic component 1. This makes it possible to bring the conductive fixture $21_5$ close to the electronic component 1 while preventing the conductive fixture $21_5$ from coming into contact with the conductive cover 30. As a result, static electricity applied to the conductive cover 30 is more easily discharged to the conductive fixture $21_5$ than the conductive terminal 1a of the electronic component 1.

Figure 11:
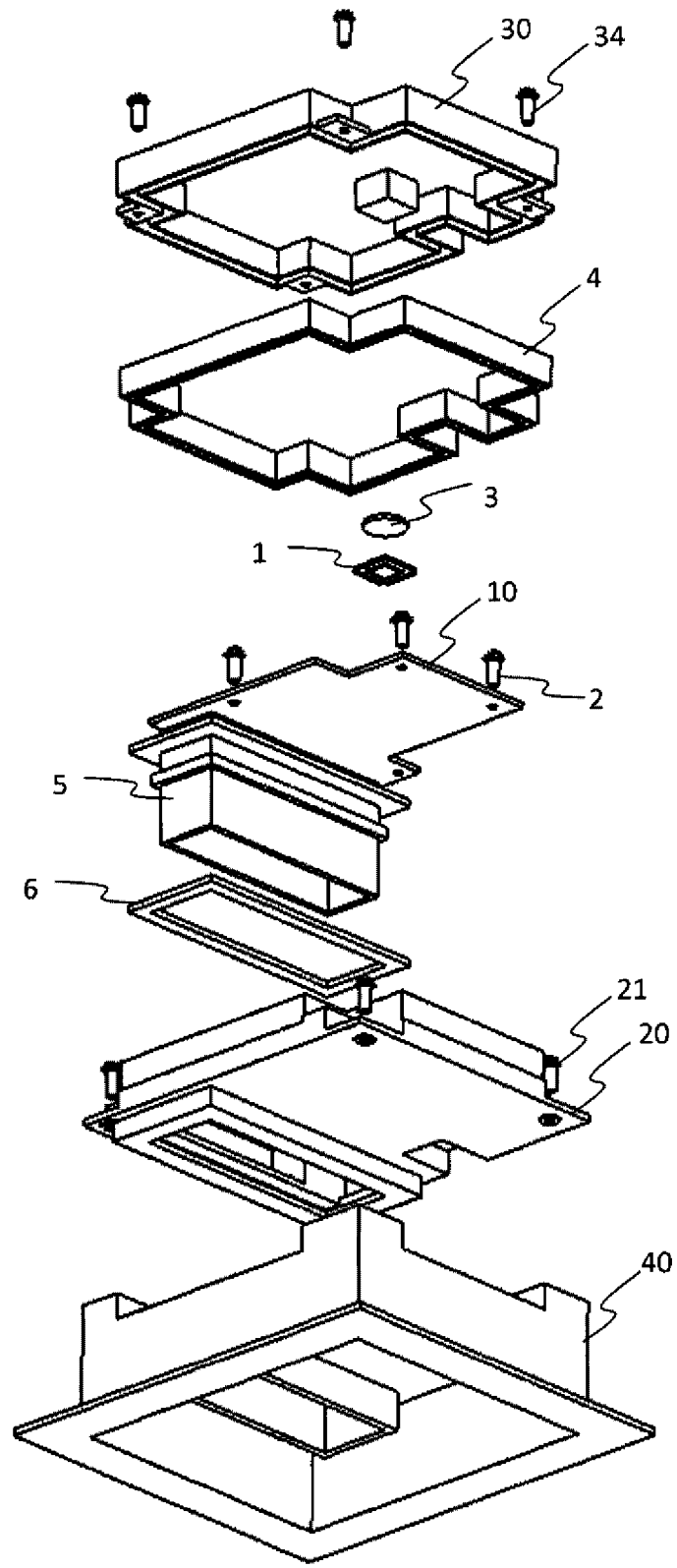
FIG. 11 is a developed view of the electronic control device according to the first embodiment.

FIG. 11 is a developed view of the electronic control device 100 according to the first embodiment. The sealing material 6 waterproofs between the connector 5 and the insulating case 20.

As described above, according to the present embodiment, it is possible to suppress failure of the electronic component 1 due to static electricity. In addition, it is possible to suppress malfunction of the electronic component 1 due to static electricity. Further, heat from the engine, the transmission, and the like is less likely to be transferred to the conductive cover 30.

(First Modification)

Figure 6:
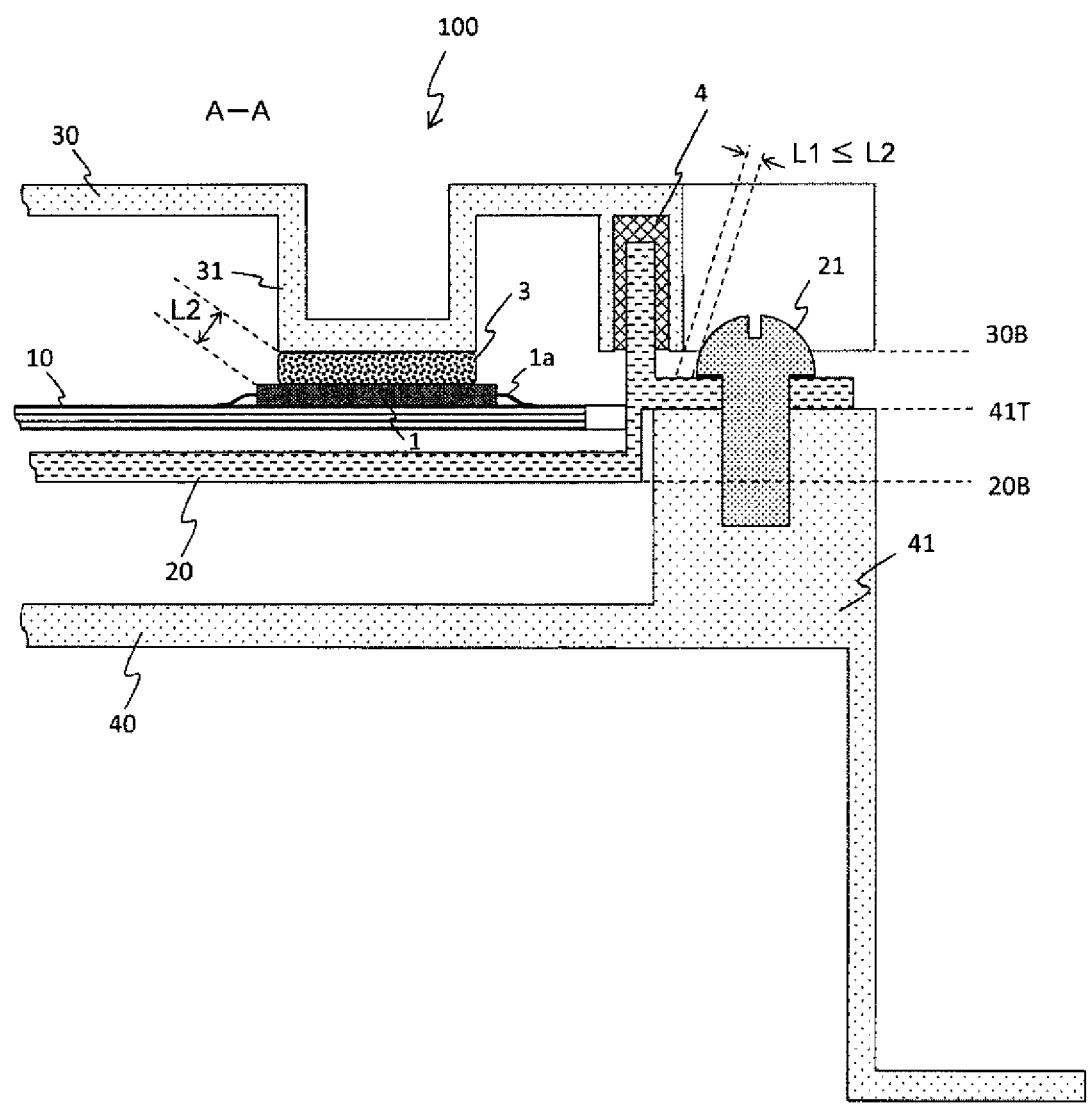
FIG. 6 is an enlarged sectional view illustrating a peripheral configuration of a conductive fixture of an electronic control device according to a modification of the first embodiment.

Next, a modification of the electronic control device 100 will be described with reference to FIG. 6. FIG. 6 is an enlarged sectional view illustrating a peripheral configuration of the conductive fixture 21 of an electronic control device 100 according to a modification of the first embodiment.

The example of FIG. 6 is different from the example of FIG. 4 in that a head portion of conductive fixture 21 has a dome shape (round head) and a chip area of the electronic component 1 is larger than a bottom area of the protrusion 31. As a result, the directions of the distances L1 and L2 are oblique.

Also in the present modification, the distance L1 between the conductive cover 30 and the conductive fixture 21 is equal to or less than the distance L2 between the conductive cover 30 and the conductive terminal 1a of the electronic component 1.

(Second Modification)

Figure 7:
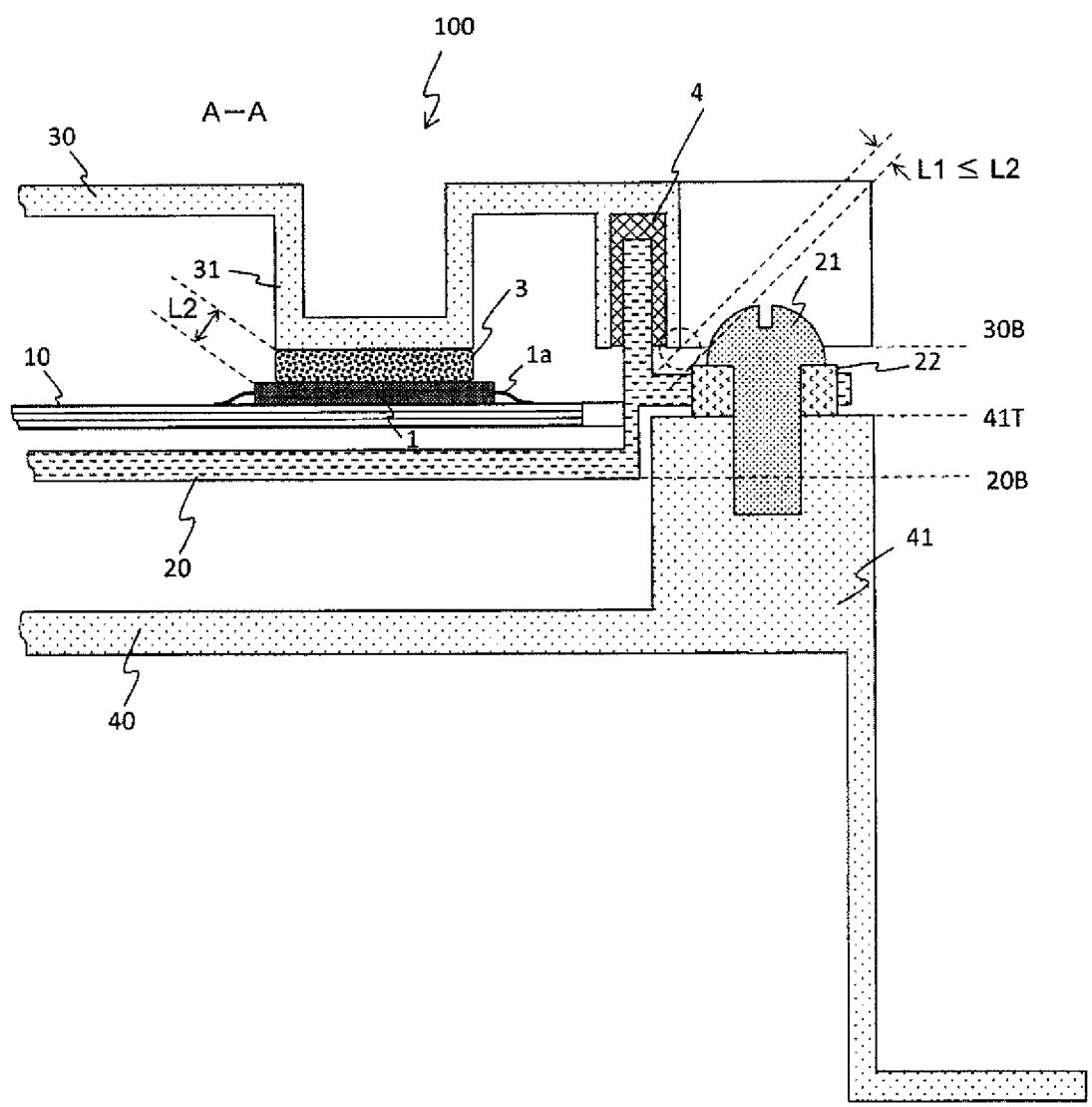
FIG. 7 is an enlarged sectional view illustrating a peripheral configuration of a conductive fixture 21 of an electronic control device according to another modification of the first embodiment.

Next, a modification of the electronic control device 100 will be described with reference to FIG. 7. FIG. 7 is an enlarged sectional view illustrating a peripheral configuration of the conductive fixture 21 of the electronic control device 100 according to another modification of the first embodiment.

The example of FIG. 7 differs from the example of FIG. 6 in that the conductive fixture 21 includes a conductive collar 22. This makes it possible to bring the combination of the conductive fixture 21 and the conductive collar 22 close to the conductive cover 30 while suppressing loosening of the conductive fixture 21.

Specifically, the distance L1 between the conductive cover 30 and the conductive collar 22 is equal to or less than the distance L2 between the conductive cover 30 and the conductive terminal 1a of the electronic component 1.

Second Embodiment

Figure 8:
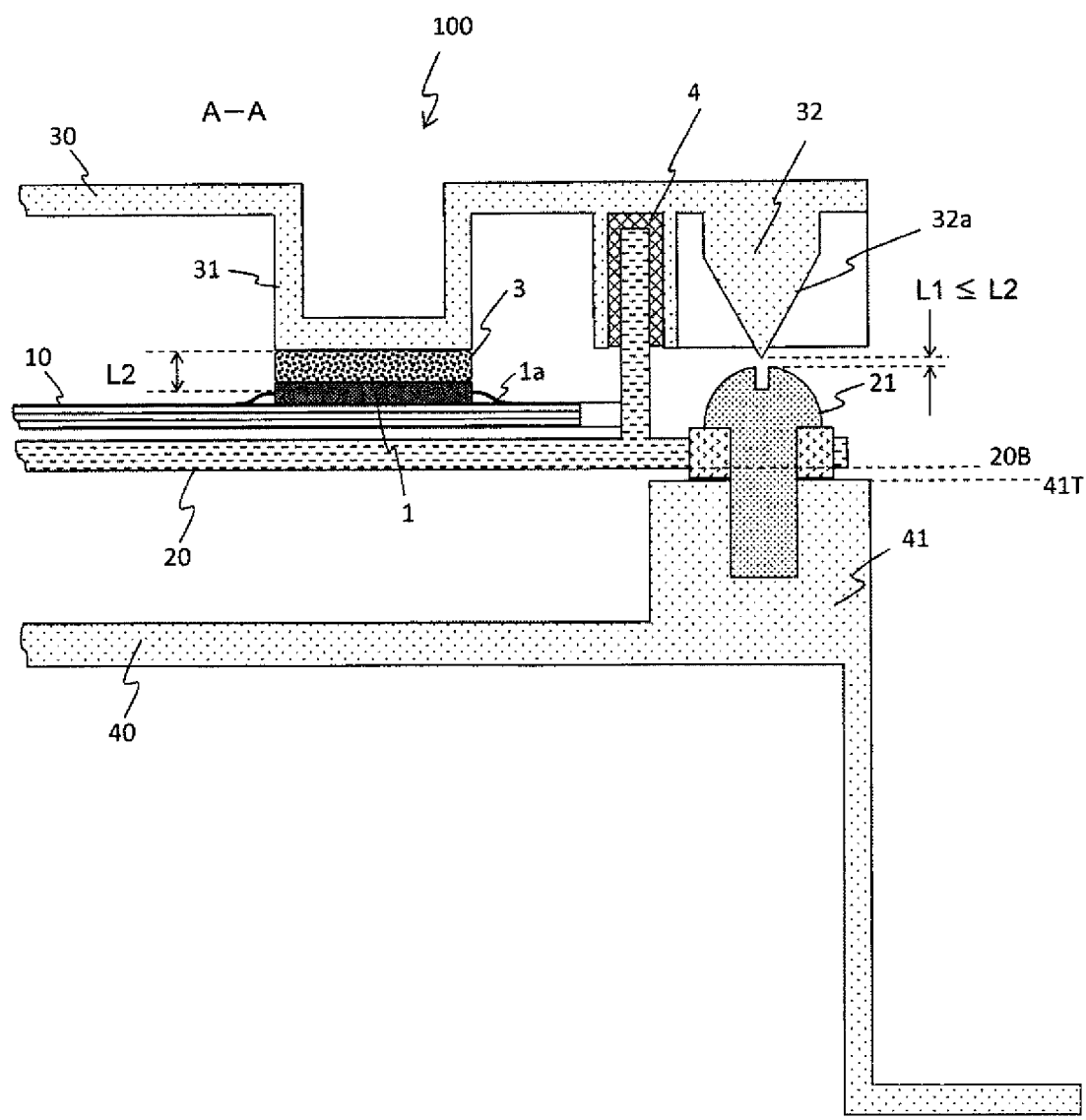
FIG. 8 is an enlarged sectional view illustrating a peripheral configuration of a conductive fixture of an electronic control device according to a second embodiment.

Next, a configuration of the electronic control device 100 according to a second embodiment will be described with reference to FIG. 8. FIG. 8 is an enlarged sectional view illustrating a peripheral configuration of the conductive fixture 21 of the electronic control device 100 according to the second embodiment.

In the present embodiment, the portion of the conductive cover 30 facing the conductive fixture 21 has a protrusion 32 protruding toward the head of the conductive fixture 21.

Thus, the conductive cover 30 can be brought close to the head of the conductive fixture 21. As a result, static electricity applied to the conductive cover 30 is easily discharged to the conductive fixture 21.

Specifically, the protrusion 32 has a tip 32a that is pointed toward the head of the conductive fixture 21. As a result, static electricity applied to the conductive cover 30 is easily discharged from the tip 32a to the conductive fixture 21.

That is, static electricity applied to the conductive cover 30 is discharged from the tip 32a to the conductive fixture due to dielectric breakdown, and is discharged from the conductive fixture 21 to the conductive base 40. Accordingly, a discharge path for static electricity from the conductive cover 30 to the conductive base 40 (body ground) can be secured.

As described above, according to the present embodiment, static electricity can be dissipated (dielectric breakdown) by bringing the portion of the conductive cover 30 facing the conductive fixture 21 close to the conductive fixture 21 and sharpening the tip.

Third Embodiment

Figure 9:
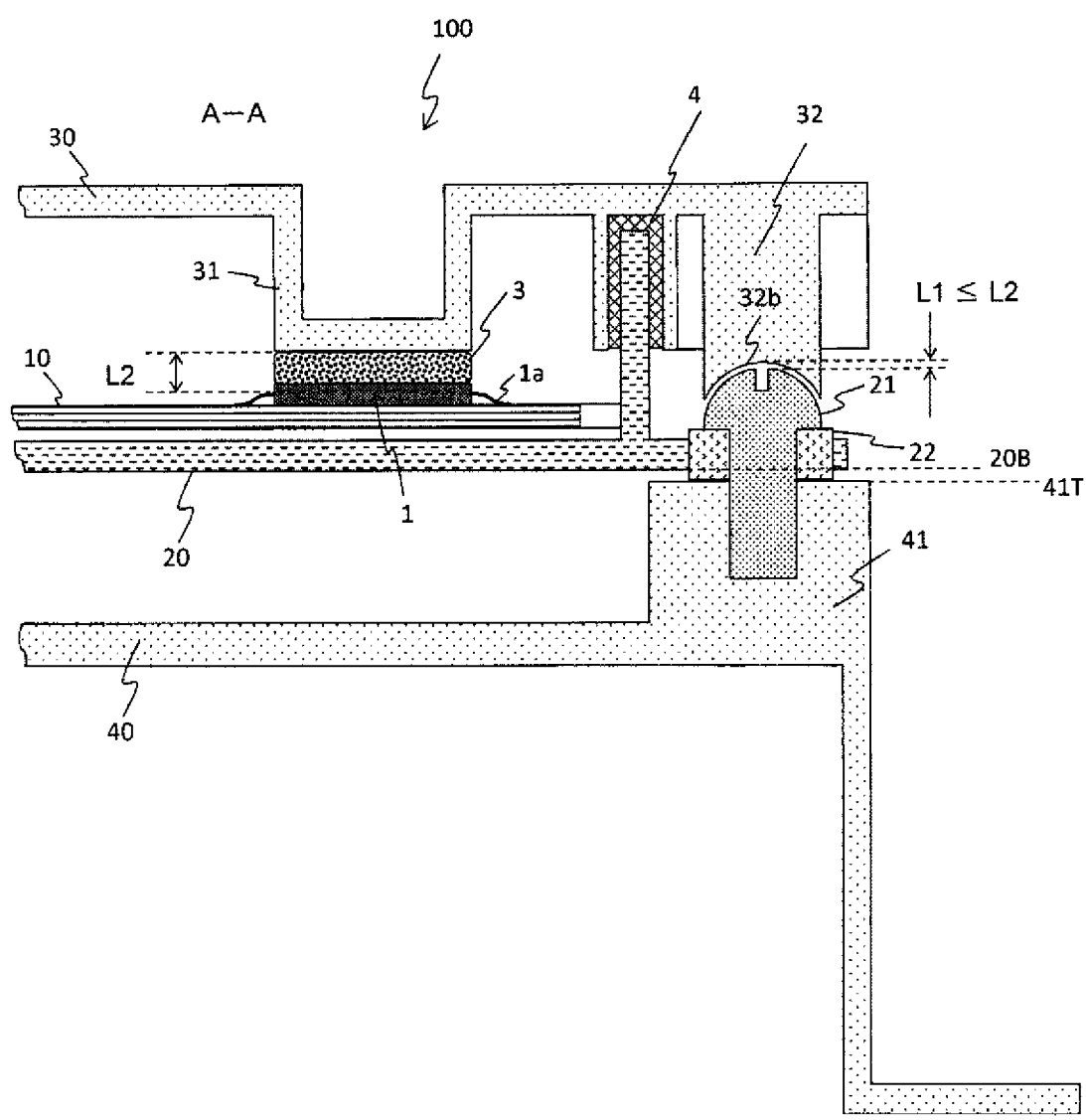
FIG. 9 is an enlarged sectional view illustrating a peripheral configuration of a conductive fixture of an electronic control device according to a third embodiment.

Next, a configuration of the electronic control device 100 according to a third embodiment will be described with reference to FIG. 9. FIG. 9 is an enlarged sectional view illustrating a peripheral configuration of the conductive fixture 21 of the electronic control device 100 according to the third embodiment.

In the present embodiment, the protrusion 32 has a recess 32b that covers the head of the conductive fixture 21.

This makes it possible to increase the area of the recess 32b facing the conductive fixture 21. As a result, electrostatic capacitance between the recess 32b and the conductive fixture 21 increases, and static electricity applied to the conductive cover 30 is more easily discharged to the conductive fixture 21 than the conductive terminal 1a of the electronic component 1.

Specifically, the recess 32b includes a surface that follows the head of the conductive fixture 21. For example, when the head of the conductive fixture 21 has a columnar shape, a hexagonal columnar shape, or a dome shape, the recess 32b is formed by a surface corresponding to the shape of each head. Consequently, the recess 32b facing the conductive fixture 21 can be entirely brought close to the surface of the head of the conductive fixture 21. As a result, the electrostatic capacitance between the recess 32b and the conductive fixture 21 can be further increased.

In the present embodiment, the head of the conductive fixture 21 has a dome shape (round head), and the recess 32b has a dome shape accordingly. This makes it possible to increase the electrostatic capacitance between the dome-shaped recess 32b and the conductive fixture 21.

The conductive base 40 includes a pedestal 41 having a hole (screw hole) into which the conductive fixture 21 is engaged (screwed). The end surface 41T of the pedestal 41 on the axial head side of the conductive fixture 21 is located on the axial foot side of the conductive fixture 21 being the same as or more than the end surface 20B of the insulating case 20 on the axial foot side of the conductive fixture 21. As a result, the height of the pedestal 41 can be the same as or lower than the end surface 20B of the insulating case 20.

As described above, according to the present embodiment, the electrostatic capacitance can be increased by increasing the area of the portion of the conductive cover 30 facing the conductive fixture 21 and approaching the conductive fixture 21. As a result, the impedance between the conductive cover 30 and the conductive fixture 21 can be reduced to release static electricity (charge transfer).

(Modifications)

Figure 10:
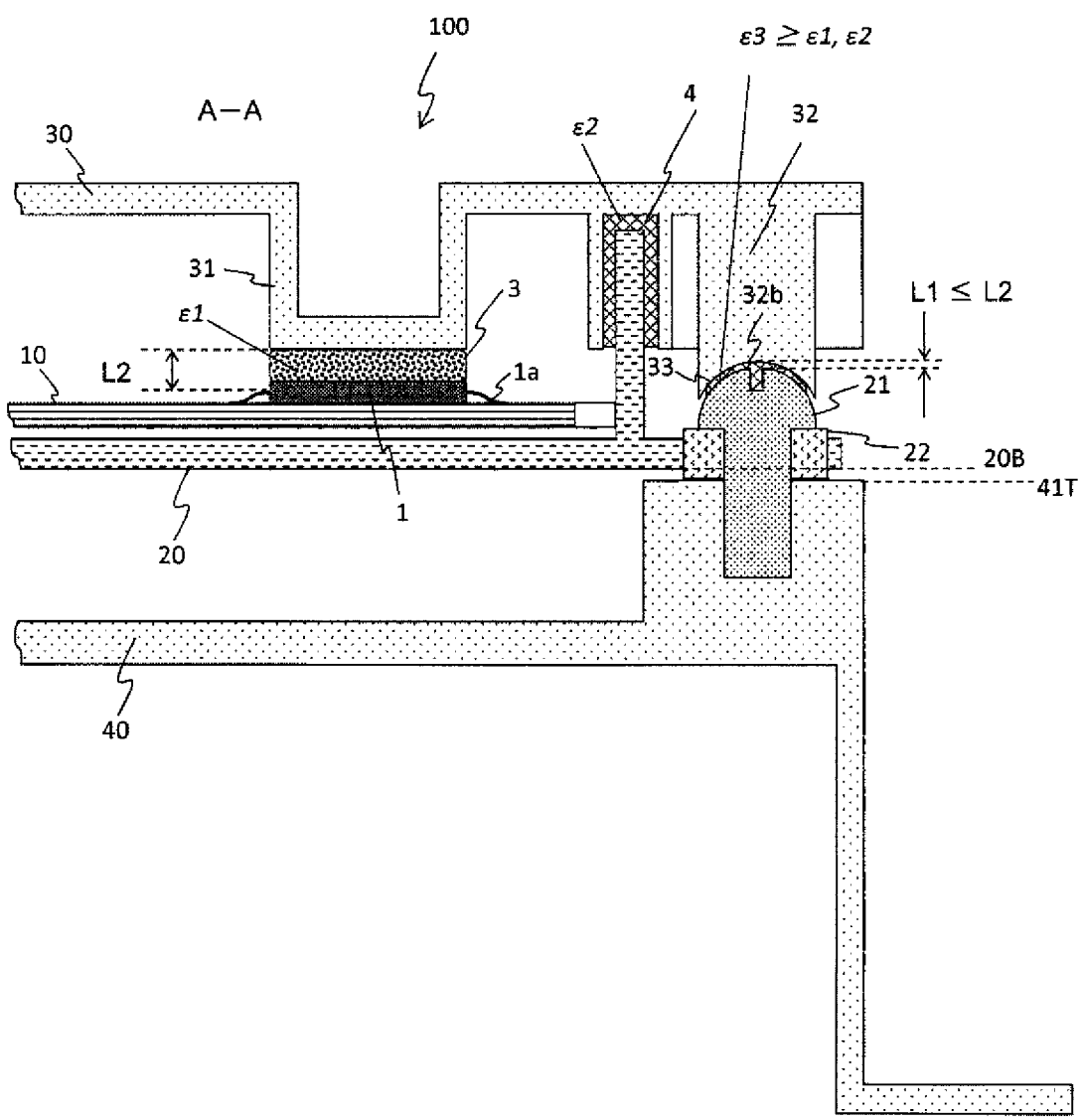
FIG. 10 is an enlarged sectional view illustrating a peripheral configuration of a conductive fixture of an electronic control device according to a modification of the third embodiment.

Next, a modification of the electronic control device 100 will be described with reference to FIG. 10. FIG. 10 is an enlarged sectional view illustrating a peripheral configuration of the conductive fixture 21 of the electronic control device 100 according to a modification of the third embodiment.

The present modification is different from the third embodiment in that a dielectric material 33 is disposed between the recess 32b and the conductive fixture 21.

The thermal conductive material 3 is disposed between the conductive cover 30 (protrusion 31) and the electronic component 1.

The sealing material 4 waterproofs between the conductive cover 30 and the insulating case 20. Here, the dielectric material 33 is disposed between the recess 32b and the head of the conductive fixture 21, and has a relative permittivity that is the same as or larger than the relative permittivity of the thermal conductive material 3 or the sealing material 4. This can further increase the electrostatic capacitance between the recess 32b and the conductive fixture 21.

Further, the present invention is not limited to the above embodiments, but various modifications may be contained. For example, the above embodiments are described in detail for easy understanding the invention, but not necessarily limited to those including all the configurations described. In addition, some of the configurations of a certain embodiment may be replaced with the configurations of the other embodiments, and the configurations of the other embodiments may be added to the configurations of a certain embodiment. In addition, some of the configurations of each embodiment may be omitted, replaced with other configurations, and added to other configurations.

Although only one conductive fixture 21 satisfies L1≤L2 in the above embodiment, a plurality of conductive fixtures may be provided. As a result, electrostatic capacitance is combined, and electrostatic capacitance can be increased.

REFERENCE SIGNS LIST 1 electronic component
1a conductive terminal
2 conductive fixture
3 thermal conductive material
4 sealing material
5 connector
6 sealing material
10 substrate
20 insulating case
21 conductive fixture
22 conductive collar
30 conductive cover
31 protrusion
32 protrusion
32a tip
32b recess
33 dielectric material
40 conductive base
41 pedestal
100 electronic control device

The invention claimed is:

1. An electronic control device, comprising:
a substrate;
an electronic component mounted on the substrate;
an insulating case that holds the substrate;
a conductive cover that covers the insulating case;
a conductive base that holds the insulating case; and
a conductive fixture that fixes the insulating case to the conductive base,
wherein a distance L1 between the conductive cover and the conductive fixture is equal to or less than a distance L2 between the conductive cover and a conductive terminal of the electronic component,
wherein
a plurality of the conductive fixtures are provided,
a distance L1 between the conductive fixture closest to the electronic component and the conductive cover is equal to or less than a distance L2 between the conductive cover and a conductive terminal of the electronic component, and
a thermal conductive material disposed between the conductive cover and the electronic component and having a withstand voltage higher than a withstand voltage of air.

2. An electronic control device, comprising:
a substrate;
an electronic component mounted on the substrate;
an insulating case that holds the substrate;
a conductive cover that covers the insulating case;
a conductive base that holds the insulating case; and
a conductive fixture that fixes the insulating case to the conductive base,
wherein a distance L1 between the conductive cover and the conductive fixture is equal to or less than a distance L2 between the conductive cover and a conductive terminal of the electronic component, and wherein
a portion of the conductive cover facing the conductive fixture includes:
a protrusion protruding toward a head of the conductive fixture.

3. The electronic control device according to claim 2, wherein the protrusion includes:
a tip pointed toward a head of the conductive fixture.

4. The electronic control device according to claim 2, wherein the protrusion includes:
a recess for covering a head of the conductive fixture.

5. The electronic control device according to claim 4, wherein the recess includes:
a surface that follows a head of the conductive fixture.

6. The electronic control device according to claim 5, wherein the recess is:
a dome shape.

7. The electronic control device according to claim 6, comprising:
a thermal conductive material disposed between the conductive cover and the electronic component;
a sealing material for waterproofing between the conductive cover and the insulating case; and
a dielectric material disposed between the recess and a head of the conductive fixture, the dielectric material having a relative permittivity equal to or greater than a relative permittivity of the thermal conductive material or the sealing material.

8. The electronic control device according to claim 1, wherein
the conductive cover includes:
a notch on a head of the conductive fixture closest to the electronic component.

9. The electronic control device according to claim 1, wherein
the conductive base includes:

a pedestal having a hole with which the conductive fixture is engaged, an end surface of the pedestal on an axial head side of the conductive fixture is located between:

an end surface of the conductive cover on an axial foot side of the conductive fixture and an end surface of the insulating case on an axial foot side of the conductive fixture.

10. The electronic control device according to claim 1, wherein the conductive base includes:

a pedestal having a hole with which the conductive fixture is engaged, an end surface of the pedestal on an axial head side of the conductive fixture is located on:

an axial foot side of the conductive fixture, the axial foot side being a same as or more than an end surface of the insulating case on an axial foot side of the conductive fixture.

11. The electronic control device according to claim 2, wherein the conductive fixture is disposed outside:

an internal space surrounded by the conductive cover and the insulating case.

12. The electronic control device according to claim 2, wherein the conductive fixture includes:

a conductive collar.

13. The electronic control device according to claim 3, wherein static electricity applied to the conductive cover is discharged from the tip to the conductive fixture by dielectric breakdown, and discharged from the conductive fixture to the conductive base.

\* \* \* \* \*